United States Patent [19]
Jones et al.

[11] Patent Number: 5,164,802
[45] Date of Patent: Nov. 17, 1992

[54] POWER VDMOSFET WITH SCHOTTKY ON LIGHTLY DOPED DRAIN OF LATERAL DRIVER FET

[75] Inventors: Frederick P. Jones, Mountaintop; Joseph A. Yedinak, Wilkes-Barre; John M. S. Neilson, Norristown, all of Pa.; Robert S. Wrathall, Durham, N.C.; Jeffrey G. Mansmann, Raleigh, N.C.; Claire E. Jackoski, Durham, N.C.

[73] Assignee: Harris Corporation, Melbourne, Fla.

[21] Appl. No.: 672,243

[22] Filed: Mar. 20, 1991

[51] Int. Cl.$^5$ .......................................... H01L 29/784
[52] U.S. Cl. .................................. 257/337; 257/341; 257/476
[58] Field of Search ............................ 357/23.4, 15, 41

[56] References Cited

U.S. PATENT DOCUMENTS

| | | | |
|---|---|---|---|
| 4,394,590 | 7/1983 | Honda | 307/584 |
| 4,521,795 | 6/1985 | Coe et al. | 357/23.4 |
| 4,590,395 | 5/1986 | O'Connor et al. | 307/570 |
| 4,631,564 | 12/1986 | Neilson et al. | 357/23.4 |
| 4,672,245 | 6/1987 | Majumdar et al. | 307/570 |
| 4,801,983 | 1/1989 | Ueno et al. | 357/15 |
| 4,811,065 | 3/1989 | Cogan | 357/23.4 |
| 4,823,172 | 4/1989 | Mihara | 357/41 |
| 4,893,158 | 1/1990 | Mihara et al. | 357/23.13 |
| 4,967,109 | 10/1990 | Steigerwald | 307/571 |

OTHER PUBLICATIONS

Bernstein, Joseph B., "Design and Fabrication of a Vertical Power MOSFET with an Integral Driver", MIT, 1986 (Master's Thesis).

Primary Examiner—William D. Larkins
Attorney, Agent, or Firm—Watov & Kipnes

[57] ABSTRACT

A monolithic semiconductor device comprises a VDMOS transistor having first and second main electrodes and a control electrode, and a lateral MOSFET having first and second main electrodes and a control electrode, wherein one of the first and second electrodes of the lateral MOSFET has a lower doping concentration than that of the first and second main electrodes of the VDMOS transistor for forming a Schottky barrier diode.

2 Claims, 2 Drawing Sheets

POWER VDMOSFET WITH SCHOTTKY ON LIGHTLY DOPED DRAIN OF LATERAL DRIVER FET

FIELD OF THE INVENTION

The present invention relates to a metal oxide semiconductor field effect transistor (MOSFET) circuit, and more particularly, to a power MOSFET diffused MOS (VDMOS) transistor having a circuit integral therewith.

BACKGROUND OF THE INVENTION

One type of power MOSFET transistor is known as a vertical diffused MOS (VDMOS) transistor. A transistor of this type is described in U.S. Pat. No. 4,631,564 to J. M. S. Neilson et al., issued Dec. 23, 1986, entitled GATE SHIELD STRUCTURE FOR POWER MOS DEVICE, and herein incorporated by reference.

Various arrangements of field effect transistors are known from the background literature in the art, as illustrated by the following references, herein incorporated by reference.

Honda U.S. Pat. No. 4,394,590 teaches an invention for providing a series arrangement of field effect transistors, permitting high voltage operation of the same, wherein resistor/capacitor biasing circuits are utilized for permitting high frequency operation of the circuit. Zener diodes are included between the gate and source electrodes of the field effect transistors in order to provide protection by limiting the voltage that occurs between the electrodes to the zener voltage, which is chosen to be lower than the breakdown voltage between the gate and source electrodes.

O'Connor et al U.S. Pat. No. 4,590,395 teaches a circuit including an FET transistor for driving a bipolar transistor. A zener diode 42 is connected between the gate of the FET transistor and its common connection with a parallel resistor 41a and capacitor 41. The zener diode 42 provides a charging and discharging path between the bipolar transistor 38 and the speed-up capacitor 41, thereby providing rapid turn-on and turn-off of transistor 38.

Majumdar et al U.S. Pat. No. 4,672,245 discloses a high frequency power switching device including a MOSFET transistor 2 driving a bipolar transistor 3, with a circuit including the combination of a zener diode and two other diodes 7 and 8 connected between the gate electrode of the MOSFET 2 and the base electrode of the bipolar 3, for permitting a single driver to be used in turning the device on and off. The diodes permit the bipolar transistor to be operated in its non-saturated region, thereby reducing the storage time of bipolar transistor 3, while widening the reverse bias safe operating area for the same. In this manner, high operating speed under relatively high current and voltage conditions is obtained, thereby enhancing the frequency response of the device.

Ueno et al U.S. Pat. No. 4,801,983 teaches a unidirectionally switching circuit that includes Schottky diodes connected between the source and drain electrodes of field effect transistors incorporated in the switching circuit. The Schottky diodes are connected in a series circuit with their associated FET, for providing unidirectionally current flow, and substantially reducing charge storage effects for enhancing the switching operation of the circuit.

Cogan U.S. Pat. No. 4,811,065 teaches the combination of a Schottky diode with a vertical DMOS transistor on a common substrate. A cross section of the DMOS transistor is shown in FIG. 6, whereas the equivalent circuit thereof is shown in FIG. 7. Note that the Schottky diode is in effect connected in parallel across the body diode of the DMOS transistor, to prevent the body diode from becoming forward biased, thereby eliminating the recovery time required for the body diode to recover from a conductive or forward biased state to a non-conductive or reversed biased state. By using the Schottky diode in the manner for diverting current from flowing through the body diode during high dv/dt operating conditions, turn-on of the DMOS transistor is enhanced. The reason is that no minority carriers can flow into the PN body diode to recombine. Also, through use of the Schottky diode, the parasitic bipolar junction transistor formed by the source, body region, and drain of the DMOS transistor cannot turn on, thereby preventing secondary breakdown of the bipolar junction transistor. Also, FIG. 5 of this patent discloses a circuit that includes the use of external diodes in combination with a DMOS transistor to avoid unwanted dv/dt turn-on. As shown in FIG. 5, an external diode is connected in parallel with the DMOS transistor, and a low voltage Schottky diode is connected in series with the DMOS transistor. In this manner, only the parallel connected silicon diode conducts current, thereby diverting current from flowing through the body diode, avoiding the unwanted storage time caused by conduction of the current through the body diode.

Mihara U.S. Pat. No. 4,893,158 discloses an overvoltage protection circuit for a power MOSFET device. In various embodiments of the invention taught in this patent, such as those shown in FIGS. 28A, 29A, 30A, and 31A, zener diodes are included in the overvoltage protection circuits to provide the overvoltage protection function.

Steigerwald U.S. Pat. No. 4,967,109 discloses a gate driver circuit that includes an inductor 28 connected in the main current conduction path between two field effect transistors 14 and 16, whereby the input capacitance of the power switching device being driven, and the inductance 28 provide a resonance circuit during turn-on for increasing the gate voltage by about twice that of the voltage of the power supply connected to the driver transistors. A Schottky diode 30 is connected between the voltage supply $V_s$ and the FET 14, for preventing the input capacitance from discharging back into the power supply.

The design and fabrication of a vertical power MOSFET with an integral driver is described in a paper by Joseph B. Bernstein, entitled "DESIGN AND FABRICATION OF A VERTICAL POWER MOSFET WITH AN INTEGRAL DRIVER", Copyright by MIT, 1986.

In power devices generally of this type, built-in circuit functions may typically be provided, utilizing diodes, lateral bipolar transistors and lateral MOS devices having N+/P junctions formed from the N+ source and P body diffusions used for forming the standard power MOS device.

As is known, a parasitic vertical NPN transistor is also formed by the VDMOS structure; a drawback of this type of device is the reduction of dv/dt capability resulting from the high gain of the parasitic bipolar vertical NPN transistor. (Typically, the presence of this transistor does not pose a serious problem in standard VDMOS devices because the N+ source diffusion is short circuited by a metal conductor connecting it to the P+ body region; the gain of the parasitic bipolar NPN transistor is thereby reduced and the dv/dt performance is thus not degraded.)

SUMMARY OF THE INVENTION

In accordance with one embodiment of the invention, a monolithic semiconductor device comprises: a VDMOS transistor having first and second main electrodes and a control electrode; and a lateral MOSFET having first and second main electrodes and a control electrode, wherein one of the first and second electrodes of the lateral MOSFET has a lower doping concentration than that of the first and second main electrodes of the VDMOS transistor.

In accordance with another embodiment of the invention, the one electrode having a lower concentration is connected to the control electrode of the VDMOS transistor.

In accordance with yet another embodiment of the invention, the one electrode is connected to the control electrode of the VDMOS transistor by way of a metallic connection, the metallic connection forming a Schottky barrier diode with the one electrode.

In accordance with still yet another embodiment of the invention, the other electrode of the lateral MOSFET is connected to one of the first and second electrodes of the VDMOS transistor.

In accordance with a further embodiment of the invention, a monolithic semiconductor device comprises a substrate of a first conductivity type material, an upper region of the substrate having a lower impurity doping concentration than a lower portion thereof; a first region of a second conductivity type material formed in the upper region of the substrate; a second region of the first conductivity type material formed in the region of the second conductivity type so as to leave an annular ring of the second conductivity material around the second region; a third region of the second conductivity type material formed in the upper region of the substrate; a fourth region of the first conductivity type material having a lower doping concentration than the second region, formed in the third region of the second conductivity type; a fifth region of the first conductivity type material formed in the third region of the second conductivity type so as to leave an annular ring of second conductivity type material around the fourth region; a layer of gate oxide overlying at least a portion of each of the annular rings; a metallic conductor contacting at least a portion of the fourth region for forming a Schottky barrier diode therewith; and a gate electrode overlying at least a portion of the gate oxide.

In accordance with still a further aspect of the invention, the metallic conductor contacts the gate electrode.

BRIEF DESCRIPTION OF THE DRAWING

Embodiments of the invention are described below in greater detail, with reference to the drawing, in which like items are indicated by the same reference designation, wherein.

DETAILED DESCRIPTION OF THE INVENTION

Figure 1:
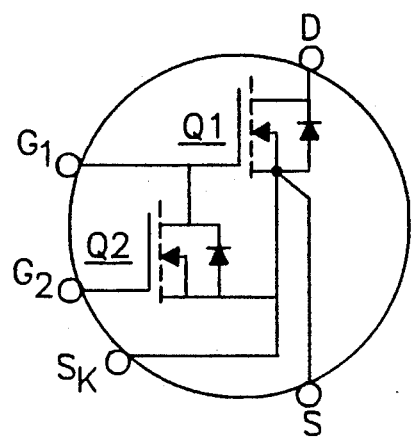
FIG. 1 shows a schematic of a circuit arrangement helpful to an understanding of the present invention.

The circuit of FIG. 1 shows an environment wherein the present invention is practiced, wherein an arrangement of a main MOSFET Q1 has drain, source and control electrodes connected to terminals D, S, and G1, respectively. A control MOSFET Q2 has its drain and source electrodes connected between the gate and source electrodes of MOSFET Q1, respectively. The control electrode of Q2 is connected to a terminal G2. Both Q1 and Q2 are formed in the same monolithic structure, having a substrate connected to a main current-carrying terminal S and an auxiliary or Kelvin-type connected terminal $S_K$ to provide an input reference for a signal applied to G2. While Q1 is formed as a vertical device or VDMOS, Q2 is formed as a lateral device, typically utilizing the same diffusions that form Q1. In the same way, other devices such as diodes and bipolar transistors can be formed in the same monolithic structure.

In operation, turn-off of Q1 is speeded up by turning on Q2. This is particularly effective in that the gate of Q1 has inherent resistance and inductance, so that a control voltage being applied to G1 has a relatively slow effect on the potential of the large gate area of Q1. With Q2 monolithically integrated into Q1, the resistance and inductance of the external path are eliminated, thereby significantly reducing the time required to discharge the gate of Q1.

However, as has been previously stated, a parasitic vertical NPN transistor is formed by the N+ source and P body diffusions of the MOSFET's. This transistor typically exhibits a relatively high gain and so may be damaged by high dv/dt. The mechanism of such damage is that a rapidly rising voltage produces a displacement current which acts as a base current to the parasitic bipolar, turning it on to a high current density at a high voltage, exceeding the power handling capability of the parasitic bipolar and thereby damaging it. Since the primary reason for the existence of this device is to perform fast switching, which inherently produces a high dv/dt, it is essential that the entire structure be able to survive exposure to a high dv/dt without damage.

Figure 2:
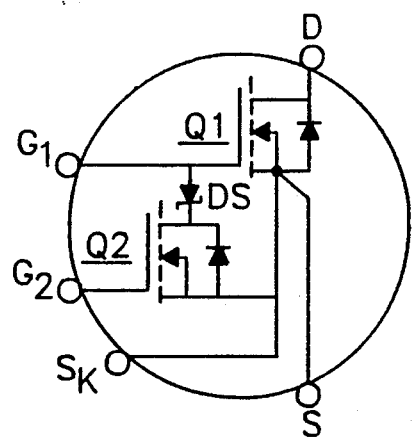
FIG. 2 shows a schematic of a circuit arrangement embodying the present invention.

In accordance with the present invention, the N+ diffusion forming Q2 source and drain electrodes is replaced with an N− diffusion, that is, a diffusion having a lower impurity concentration. It is possible to form a Schottky barrier type diode between a metallic conductor and a relatively lightly doped semiconductor region. Such a diode Ds is thereby formed in the connection between G1 and the drain electrode of Q2, as shown in FIG. 2.

In operation, the higher resistivity N material causes the emitter efficiency and consequently, the current gain of the parasitic vertical NPN transistor to be low compared with the gain of the corresponding device in the FIG. 1 arrangement. Furthermore, Schottky diode Ds is constructed to become reverse biased when the emitter base junction of the parasitic NPN is forward biased, that is, when this parasitic NPN transistor is conductive, thereby further reducing its current gain. With both the gain of the parasitic NPN transistor reduced, and the added voltage drop of the Schottky diode, the dv/dt capability of the overall device is restored to a higher value without any significant degradation of other performance parameters.

Figure 3:
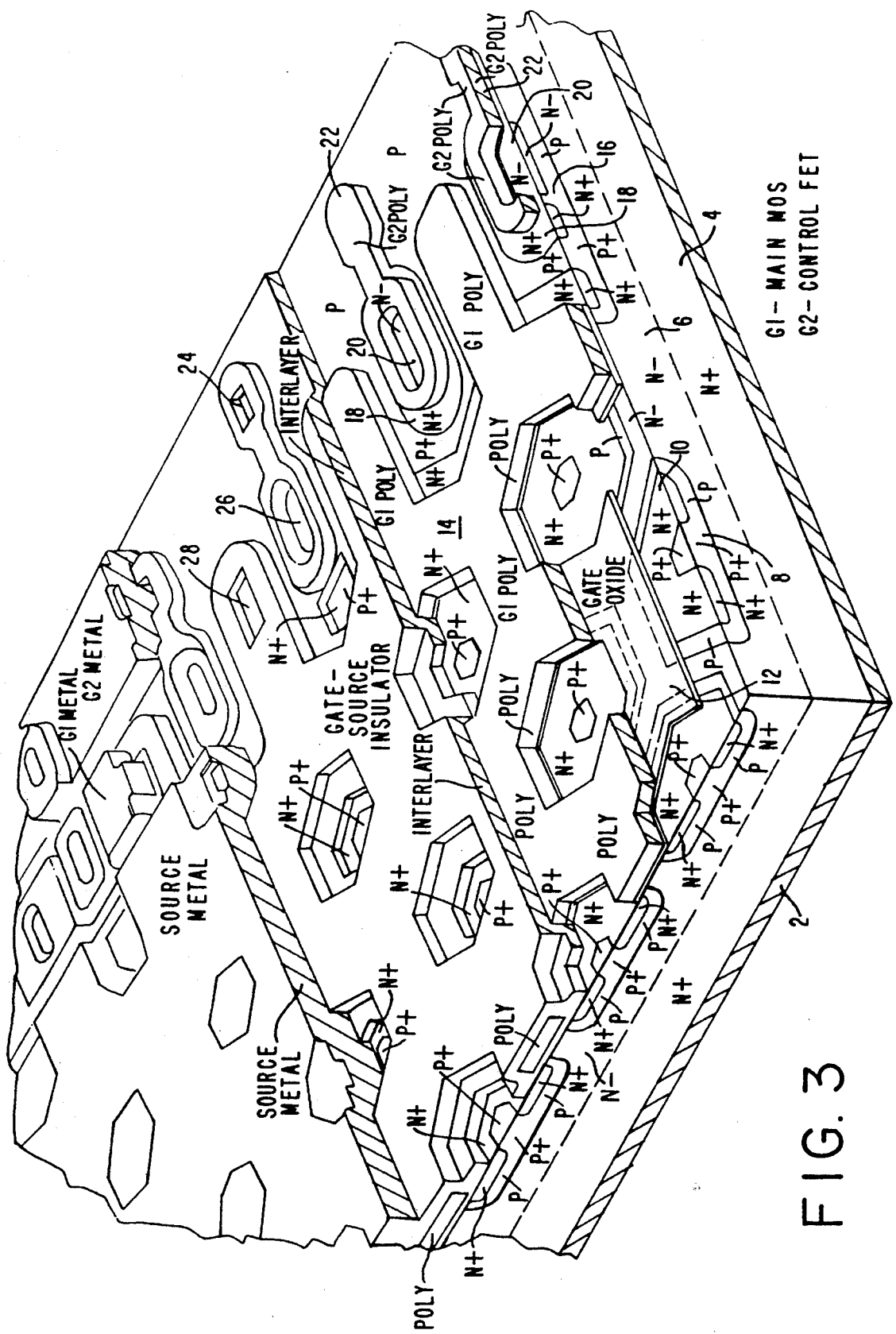
FIG. 3 shows an isometric view in section, not to scale, of a portion of a power MOSFET incorporating the present invention.

FIG. 3 shows a cross-sectional view of a semiconductor structure in accordance with an exemplary embodiment of the present invention, and typically forming part of an integrated circuit. It will be understood in the following description that P-type and N-type conductivity materials are herein referred to as P and N materials, respectively. It will also be understood that the effective device in each case comprises a parallel connection of a respective plurality of similar devices in each case in a manner known in the art. A drain contact 2 has formed thereon an N+ substrate 4, whereof an upper portion 6 is of a lower doping concentration N− and has a P well 8 formed therein. An N+ region 10 is formed in P well 8 for forming one of the main electrodes of a VDMOS transistor, such as Q1. A gate oxide layer 12 is formed over the channel region of the VDMOS transistor and over this is formed the gate electrode 14 of polysilicon.

A further P well 16 is formed in portion 6 of substrate 4, wherein is formed a lateral MOSFET, for example, Q2. An N+ region 18 formed in P well 16 constitutes the source region, and an N− region 20 constitutes the drain region of the lateral MOSFET. A gate electrode 22 is formed over a gate oxide layer over the channel region of the lateral MOSFET. As explained, a metal connection to the N− drain region 20 forms a Schottky barrier therewith in accordance with the present invention. In FIG. 3, 24 is an opening for gate terminal metal to contact the gate electrode of the lateral MOSFET, 26 is an opening for the gate terminal metal connection to the gate of the VDMOS to contact the drain of the lateral MOSFET, and 28 is an opening for gate terminal metal to contact the gate electrode of the VDMOS.

An embodiment of the invention has been described above for purposes of illustration. However, such an embodiment is not meant to be limiting, and those of ordinary skill in the art may recognize ways to modify such an embodiment without departing from the fundamental concept of the invention, or departing from the spirit and scope of the appended claims. For example, while the exemplary embodiment has been described in terms of particular conductivity types, converse conductivity types may be used so long as the relative conductivity types remain the same. The appended claims are meant to cover such modifications.

What we claim is:

1. A monolithic semiconductor device comprising:
   a substrate of a first conductivity type material, an upper region of said substrate having a lower impurity doping concentration than a lower portion thereof;
   a first region of a second conductivity type material formed in said upper region of said substrate;
   a second region of said first conductivity type material formed in said first region of said second conductivity type so as to leave an annular ring of said second conductivity material around said second region;
   a third region of said second conductivity type material formed in said upper region of said substrate;
   a fourth region of said first conductivity type material having a lower doping concentration than said second region, formed in said third region of said second conductivity type;
   a fifth region of said first conductivity type material formed in said third region of said second conductivity type so as to leave an annular ring of second conductivity type material around said fourth region;
   a layer of gate oxide overlying at least a portion of each of said annular rings;
   metallic conductor means contacting at least a portion of said fourth region for forming a Schottky barrier diode therewith; and
   a gate electrode overlying at least a portion of said gate oxide.

2. A monolithic semiconductor device in accordance with claim 1, wherein said metallic conductor means contacts said gate electrode.

* * * * *

UNITED STATES PATENT AND TRADEMARK OFFICE
CERTIFICATE OF CORRECTION

PATENT NO. : 5,164,802

DATED : November 17, 1992

INVENTOR(S) : Frederick P. Jones et al.

It is certified that error appears in the above-identified patent and that said Letters Patent is hereby corrected as shown below:

Column 1, line 4, before "diffused" insert --vertically--.

Signed and Sealed this

Twelfth Day of October, 1993

*Attest:*

BRUCE LEHMAN

*Attesting Officer*     *Commissioner of Patents and Trademarks*